United States Patent
Masghati

[19]

[11] Patent Number: 6,134,093
[45] Date of Patent: Oct. 17, 2000

[54] CATEGORY 5/25-PAIR PROTECTOR

[75] Inventor: Mohammad Masghati, Carol Stream, Ill.

[73] Assignee: Illinois Tool Works Inc., Glenview, Ill.

[21] Appl. No.: 09/275,199

[22] Filed: Mar. 24, 1999

[51] Int. Cl.[7] ................................................ H02H 1/00
[52] U.S. Cl. ............................... 361/119; 361/111
[58] Field of Search ................................. 361/119, 111, 361/56, 823; 439/620; 379/412

[56] References Cited

U.S. PATENT DOCUMENTS

| | | | |
|---|---|---|---|
| 4,595,799 | 6/1986 | Krob et al. | 379/397 |
| 4,968,264 | 11/1990 | Ruehl et al. | 439/622 |
| 5,483,409 | 1/1996 | Heidorn et al. | 361/119 |
| 5,841,620 | 11/1998 | Masghati | 361/119 |

Primary Examiner—Michael J. Sherry
Attorney, Agent, or Firm—Donald J. Breh; Mark W. Croll; John P. O'Brien

[57] ABSTRACT

A Category 5/25-pair circuit protection assembly for protecting telecommunication related equipment and the like from power and transient surges includes a two-piece interfitting housing which receives a main printed circuit board for mounting sockets therein, a plurality of individual miniature auxiliary printed circuit boards each for mounting a Category 5/circuit surge protector device, an exposed side connector device, and a protected side connector device. The housing is designed to fit into the same footprint as that of the conventional 66-M type terminal block. Each of the miniature auxiliary printed circuit boards is adapted to be plugged into the corresponding sockets mounted on the main printed circuit board so as to facilitate the individual replacement of damaged protector devices. Each of the exposed side and protected side connector devices may be of any one of a number of different types of connectors so as to provide versatility.

18 Claims, 6 Drawing Sheets

UNPROTECTED 25-PAIR CAT5 CABLE

PROTECTED 25-PAIR CAT5 CABLE

CATEGORY 5/25-PAIR PROTECTOR

BACKGROUND OF THE INVENTION

This invention relates generally to telephone surge protection circuitry and more particularly, it relates to a circuit protection assembly having a two-piece interfitting housing which receives a main printed circuit board for mounting sockets therein, a plurality of individual auxiliary miniature printed circuit boards each for mounting a Category 5/circuit surge protector device and for plugging into the respective sockets, an exposed side connector device, and a protected side connector device for protecting telecommunication related equipment and the like with up to 25-pairs of wires.

While there are known in the prior art of a 25-pair circuit protection assembly for protecting telecommunication related equipment having up to 25-pairs of wires from transient voltage/current surges, the surge protector devices therein do not meet the current Telecommunication Industry Association (TIA) for Category 5 specification (#568A). Such 25-pair circuit protection assembly of the prior art is described and illustrated in U.S. Pat. No. 5,483,409 to R. H. Heidorn et al. issued on Jan. 9, 1996, and assigned to the same assignee as the present invention. This '409 patent is hereby incorporated by reference. In FIGS. 1 through 7, the 25-pair circuit protection assembly includes a two-piece interfitting housing 12, a printed circuit board sub-assembly 30, an exposed side connector device 46, and a protected side connector device 54. A printed circuit board 56 is mounted inside the housing and is adapted to receive any number of circuit protector devices. Schematic circuit diagrams of the various circuit protector devices are illustrated in FIGS. 7, 10, 11 and 16. However, none of these various circuit protector devices were able to protect telephone communication equipment from power and transient surges and also meet the current TIA specification for Category 5.

The present invention represents improvements over the above-discussed '409 patent that could not meet the TIA specification for Category 5. Thus, the inventors of the present invention have developed an improved circuit protection assembly for protecting telecommunication related equipment and the like with up to 25-pairs of wires from power and transient surges and yet still meet the TIA specification for Category 5. In the present invention, the housing has been designed to fit into the same footprint as that of a conventional 66-M type terminal block. A printed circuit board sub-assembly includes a main printed circuit board and is fixedly mounted internally of the housing and is adapted to receive 25 individual Category 5/circuit surge protector devices so as to provide the protection against power and transient surges. Further, the printed circuit board sub-assembly includes a first terminal connector device disposed on the exposed side and a second terminal connector device disposed on the protected side. Each of the 25 Category 5/circuit surge protector devices is mounted on an associated auxiliary miniature printed circuit board adapted to be plugged into corresponding sockets mounted on the main printed circuit board so as to facilitate the individual replacement of damaged protector devices.

SUMMARY OF THE INVENTION

Accordingly, it is a general object of the present invention to provide a novel and improved Category 5/25-pair circuit protection assembly which is relatively simple and economical to manufacture and assemble.

It is an object of the present invention to provide a Category 5/25-pair circuit protection assembly which includes a two-piece interfitting housing for receiving a main printed circuit board for mounting sockets therein, a plurality of individual auxiliary miniature printed circuit boards each for mounting a Category 5/circuit surge protector device and for plugging into the respective sockets, an exposed side connector device, and a protected side connector device.

It is another object of the present invention to provide a method for fabricating a circuit surge protector device which employs a unique construction of a main printed circuit board for mounting a plurality of auxiliary miniature printed circuit boards thereon each having a circuit surge protector device in order to meet the TIA specification for Category 5.

It is still another object of the present invention ro provide a Category 5/25-pair circuit protection assembly which is characterized by a design which greatly facilitates the replacement of damaged circuit surge protector devices into telephone communication equipment.

In a preferred embodiment of the present invention, there is provided a Category 5/25-pair circuit protection assembly for protecting telephone communication related equipment and the like from power and transient surges which includes a housing formed of co-mating base and cover members. The base and cover members have outer confronting side wall members. The side wall members of the base member are recessed so as to form a cavity. A main printed circuit board is disposed within the cavity of the housing. A plurality of socket connectors are mounted upon the main printed circuit board disposed within the cavity of the housing. A plurality of auxiliary miniature printed circuit boards are mounted in corresponding ones of the plurality of socket connectors. A plurality of circuit surge protector devices are mounted in corresponding ones of the plurality of auxiliary miniature printed circuit boards. An input side electrical connector is adapted to supply a first 25-pairs of wires to the main printed circuit board. An output side electrical connector is adapted for receiving a second 25-pairs of wires from the main printed circuit board.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
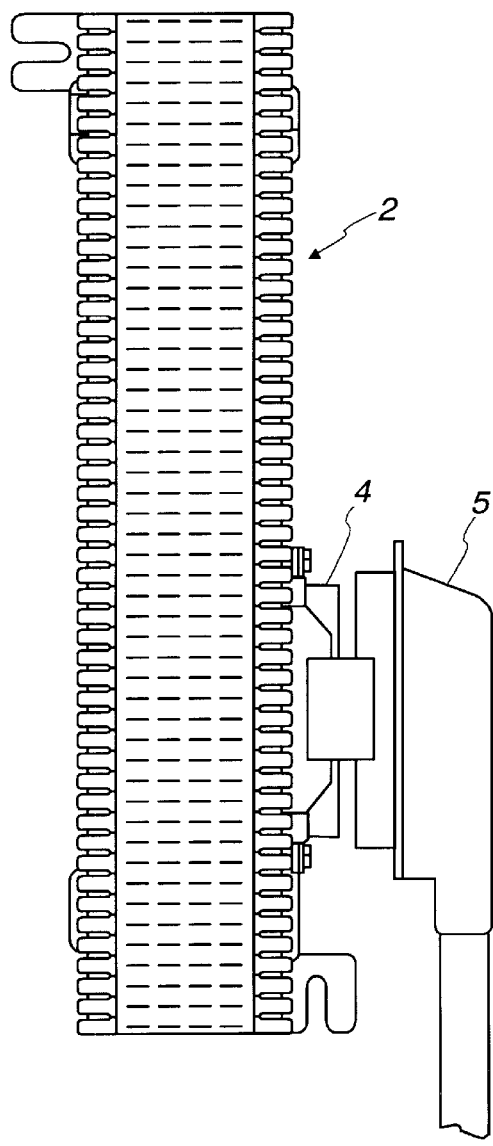
FIG. 1 is a front plan view of a conventional 66-M terminal block of the prior art.
Figure 2:
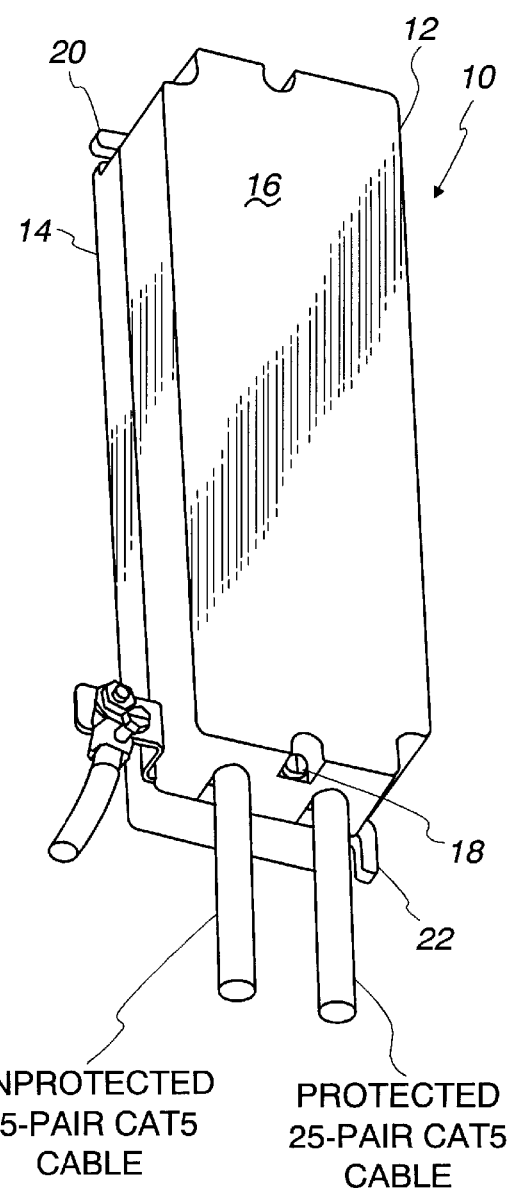
FIG. 2 is a perspective view of a Category 5/25-pair circuit protection assembly, constructed in accordance with the principles of the present invention.
Figure 3:
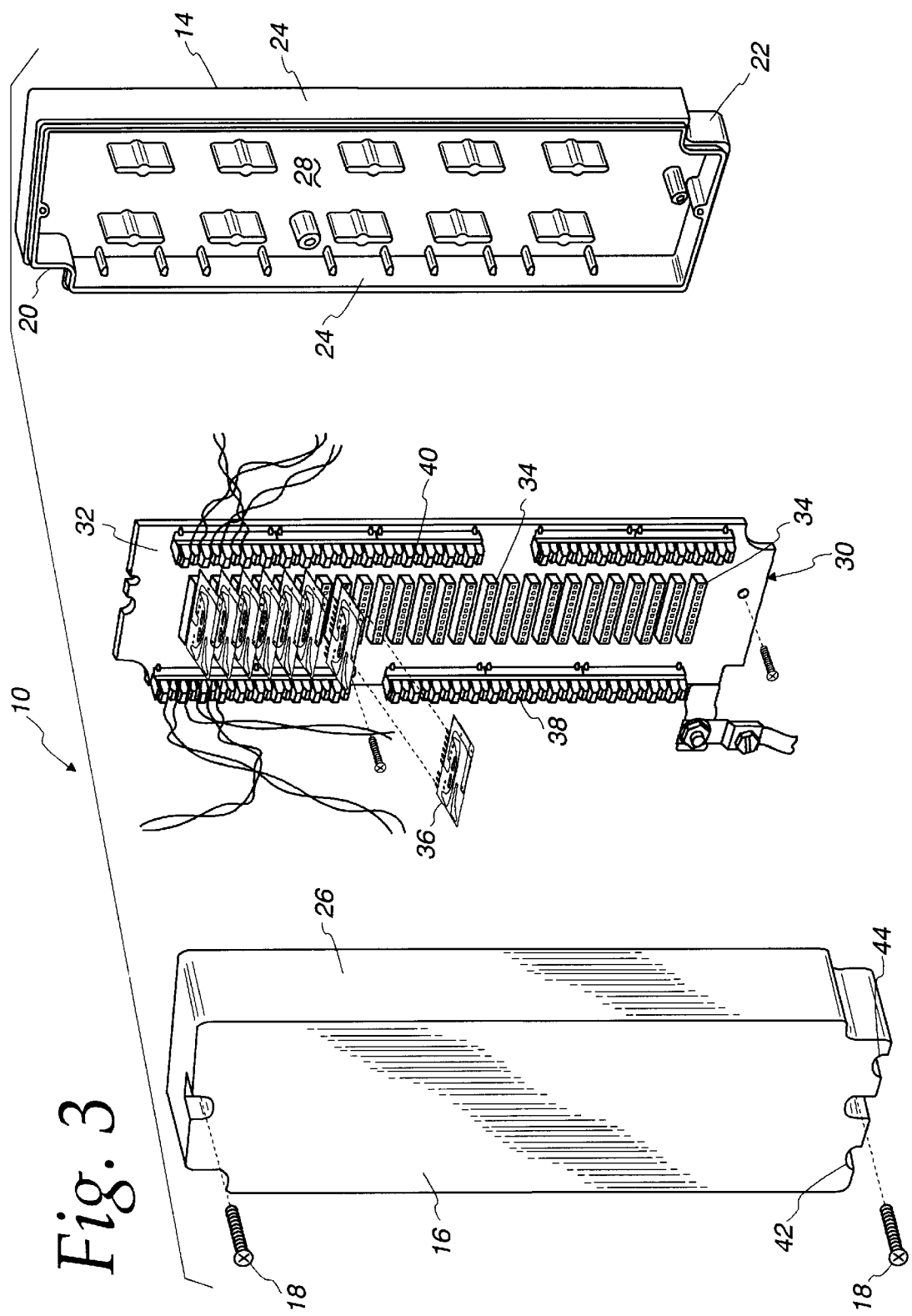
FIG. 3 is an exploded perspective view of the Category 5/25-pair circuit protection assembly of FIG. 2.
Figure 4:
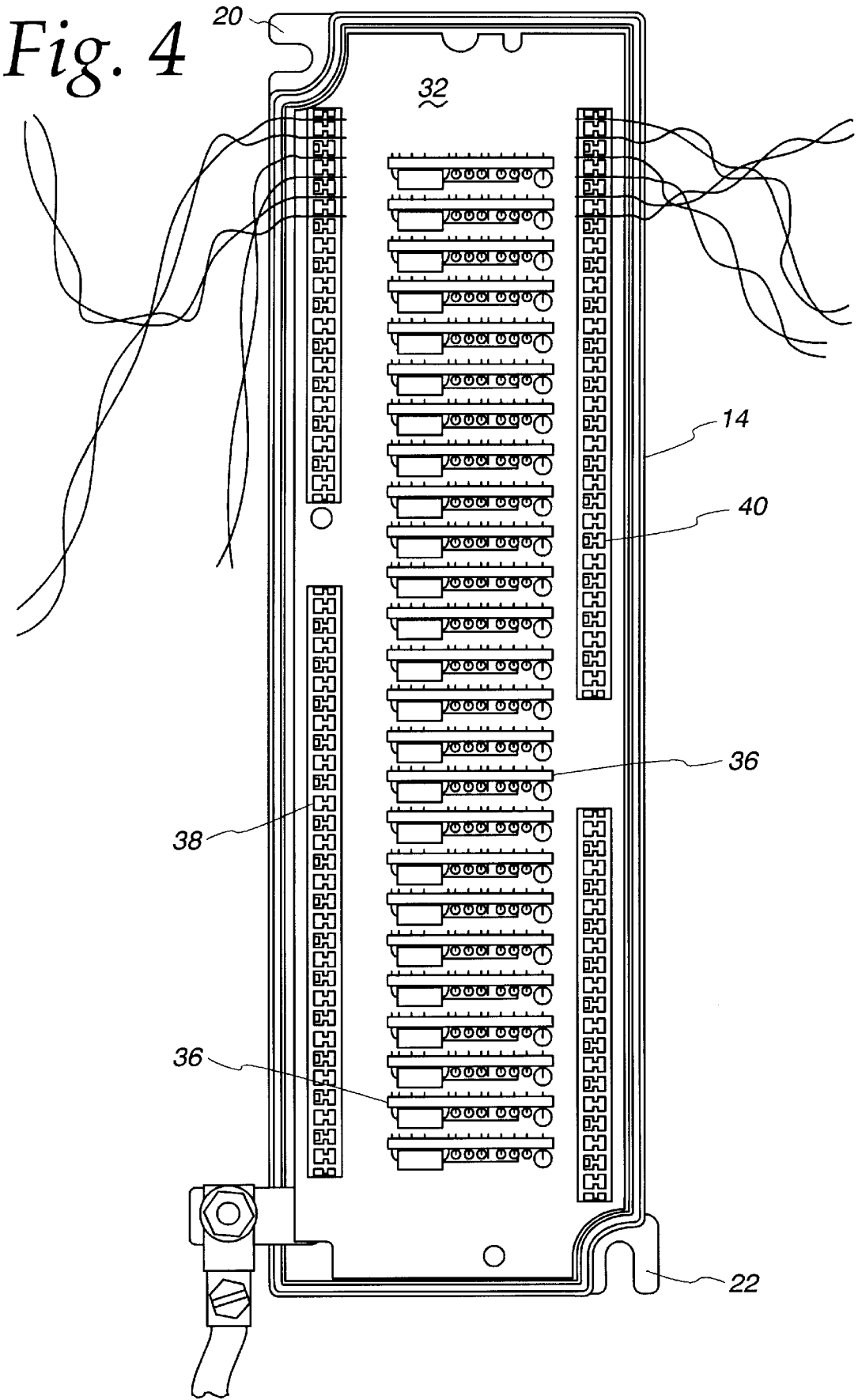
FIG. 4 is a top plan view of FIG. 2, with the cover member removed.

Referring now in detail to the various views of the drawings, there is shown in FIGS. 2 through 9 an improved Category 5/25-pair circuit protection assembly 10 which is constructed in accordance with the principles of the present invention. It suitably fits into the footprint of a conventional 66-M type terminal connector block 2 having side connector 4 joined to a plug 5 (as illustrated in FIG. 1) in common use in telephone communication related equipment and other electronic applications. The improved circuit protection assembly 10 is utilized to protect sensitive communication equipment comprising up to 25-pairs of wires (50 lines) from transient voltage surges and overcurrent conditions but yet still meets the TIA specification for Category 5. The improved circuit protection assembly 10 may be used as a network interface in a multitude of customer applications because it can accommodate a number of different input/output connector devices.

The improved circuit protection assembly 10 includes a molded housing 12 made of a suitable plastic material, such as polycarbonate and the like which is comprised of a base member 14 and a co-mating cover member 16. The cover member 16 can be secured to and interlocks with the base member 14 by a pair of captive screws 18. When the cover member 16 is removed from the base member 14, the captive screws are designed so as to be retained in the cover member 16. The housing 12 has a generally rectangular configuration and is adapted to be mounted into the footprint of the 66-M type terminal block by means of upper and lower mounting projections 20 and 22.

The base and cover members 14 and 16 are provided with outer confronting side wall members 24 and 26, respectively. The two side wall members 24 of the base member 14 are recessed so as to form a cavity 28 for receiving and enclosing a printed circuit board sub-assembly 30.

The printed circuit board sub-assembly 30 includes a main printed circuit board 32, a plurality (25) of card edge or socket connectors 34, a plurality (25) of auxiliary miniature printed circuit boards 36, an input or exposed side connector device 38, and an output or protected side connector device 40. As illustrated in this particular embodiment, the input side connector device 38 is preferably a 25-pair 110D connecting block, such as is commercially available from AT&T. The output side connector block 40 is also preferably a 25-pair 110D connecting block, which is the same as the input side connector block 38. Each of the 110D connecting blocks 38, 40 has pins located on their bottom sides so as to be solder mounted on the opposed sides of the main printed circuit board 32 and have insulation displacement terminals to accept 25-pairs of discrete wires to be punched down into it. It should be clearly understood that other types of connector means for either the exposed or protected side may include any number of punch-down type terminal connectors such as 66, Krone-type, or B1X.

The bottom end of the base and cover members 14 and 16 is provided with a first short tubular extension 42 which serves as a conduit for bringing in a 25-pair cable, that is supplied by the telephone company, and is terminated at the input side 110D connecting block 38 on the main printed circuit board 32. The bottom end of the base and cover member is also provided with a second short tubular extension 44 which serves as a conduit for bringing out a 25-pair cable from the output side 110D connecting block 40 to the user.

Each of the plurality of card edge or socket connectors 34 is mounted on the main printed circuit board 32 in a central portion thereof. The socket connectors 34 are similar to those commercially available from WinPoint America of Westfield, Ind., under their Part No. 1521D-10-S-02. Each of the socket connectors 34 includes a plurality of contacts for effecting electrical connection with a corresponding one of the plurality of auxiliary miniature printed circuit boards 36. The auxiliary miniature printed circuit boards 36 are designed for plug-in assembly via a right angle header 46 into the associated socket connectors 34. Each of the plurality of auxiliary miniature printed circuit boards 36 has mounted thereon an individual circuit surge protector device 48 which functions in conjunction with the plurality of conductive traces on the main printed circuit board 32 in order to meet the TIA specification for Category 5. The right angle headers 46 are similar to those commercially available from WinPoint America under their Part No. 201RA-10-S-2-01-G. A schematic circuit diagram of one of the circuit surge protector devices 48 is illustrated in FIG. 9 of the drawings.

Figure 9:
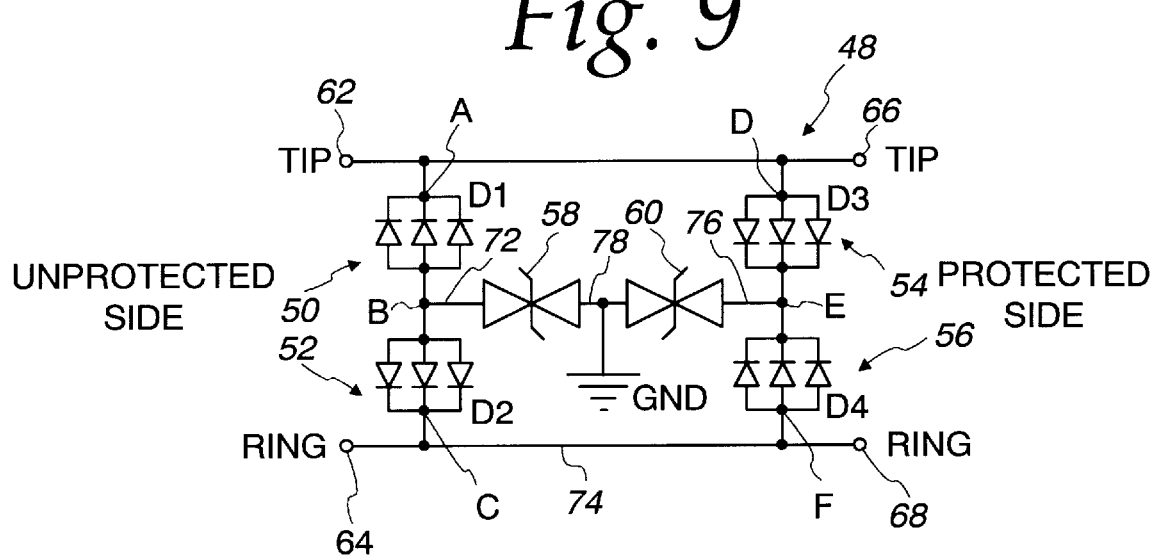
FIG. 9 is a schematic circuit diagram of one of the Category 5/circuit surge protector devices of FIG. 8.

As can be seen from FIG. 9, the circuit surge protector device 48 is comprised of four banks 50, 52, 54 and 56 of rectifier diodes and a pair of voltage suppressors 58, 60. The input side of the protector device 48 is connectable between two wires of incoming telephone transmission lines applied across an input tip terminal 62 and an input ring terminal 64 defining an unprotected side. The output side of the protector device 48 is connectable between two wires of individual telephone equipment to be protected applied across an output tip terminal 66 and an output ring terminal 68 defining a protected side.

Each of the four banks 50–56 of diodes is comprised of three (3) low capacitance diodes connected in parallel. The first bank 50 is formed of three diodes D1 connected in parallel with their common cathodes connected together at a node A and further joined to a first conductor lead 70. The common anodes of the diodes D1 are also connected together at node B and further joined to a second conductor lead 72. The second bank 52 is formed of three diodes D2 connected in parallel with their common cathodes connected together at node C and further joined to a third conductor lead 74. The common anodes of the diodes D2 are also connected together at the node B and to the second conductor lead 72.

Similarly, the third bank 54 is formed of three diodes D3 connected in parallel with their common anodes connected together at node D and further joined to the first conductor lead 70. The common cathodes of the diodes D3 are also connected together at node E and further joined to a fourth conductor lead 76. The fourth bank 56 is formed of three diodes D4 connected in parallel with their common anodes connected together at node F and further joined to the third conductor lead 74. The common cathodes of the diodes D4 are also connected together at the node E and to the fourth conductor lead 76. Each of the diodes D1–D4 in the respective banks 50–56 can be similar to the type BAV21 which has a low capacitance.

The first voltage suppressor 58 has its one end connected to the second conductor lead 72 and its other end connected to a ground source GND via a ground conductor lead 78. Similarly, the second voltage suppressor 60 has its one end connected to the fourth conductor lead 76 and its other end connected also to the ground conductor lead 78. Each of the voltage suppressors 58 and 60 may be formed of a silicon avalanche suppressor (SAS), sidactor, gas tube, or Zener diode. In this preferred embodiment, the voltage suppressors 58, 60 are silicon avalanche suppressors similar to the type 1.5 KE18CA.

Figure 5:
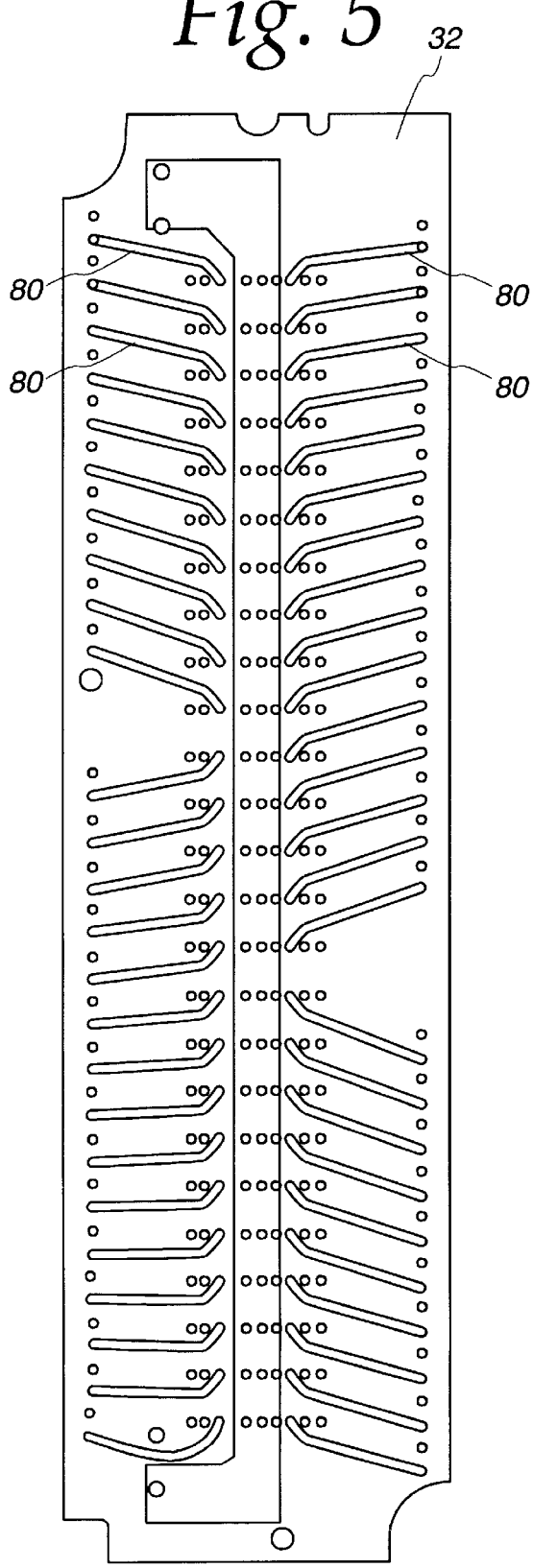
FIG. 5 is a top plan view of the main printed circuit board with the electrical components removed, illustrating the layout of the tip conductive traces.
Figure 6:
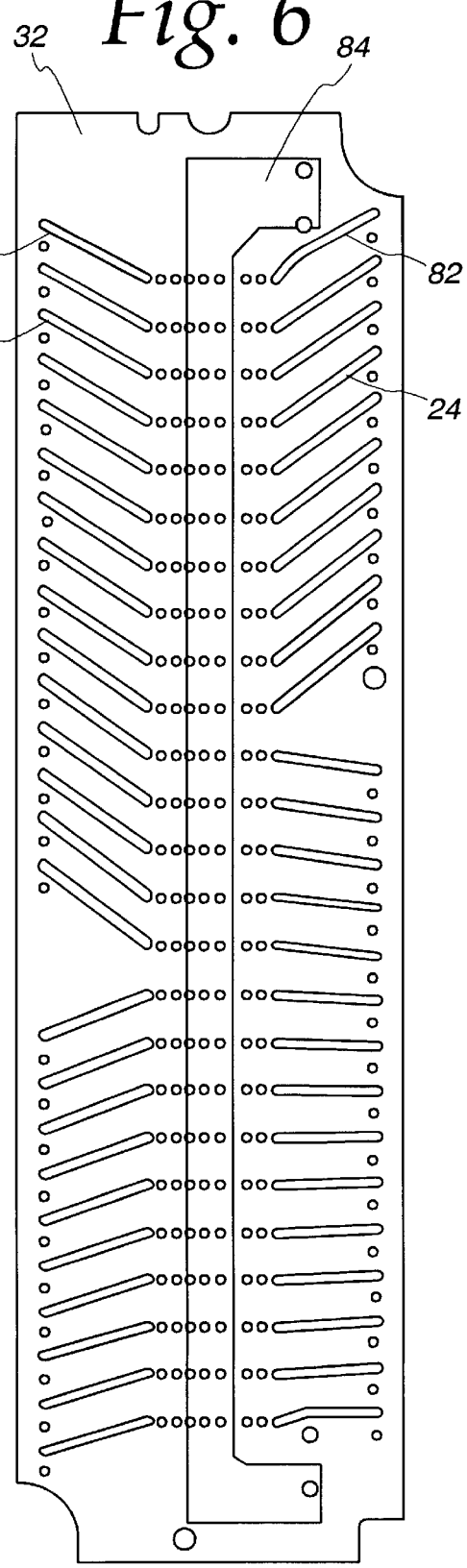
FIG. 6 is a bottom plan view of the main printed circuit board, illustrating the layout of the ring conductive traces.
Figure 7:
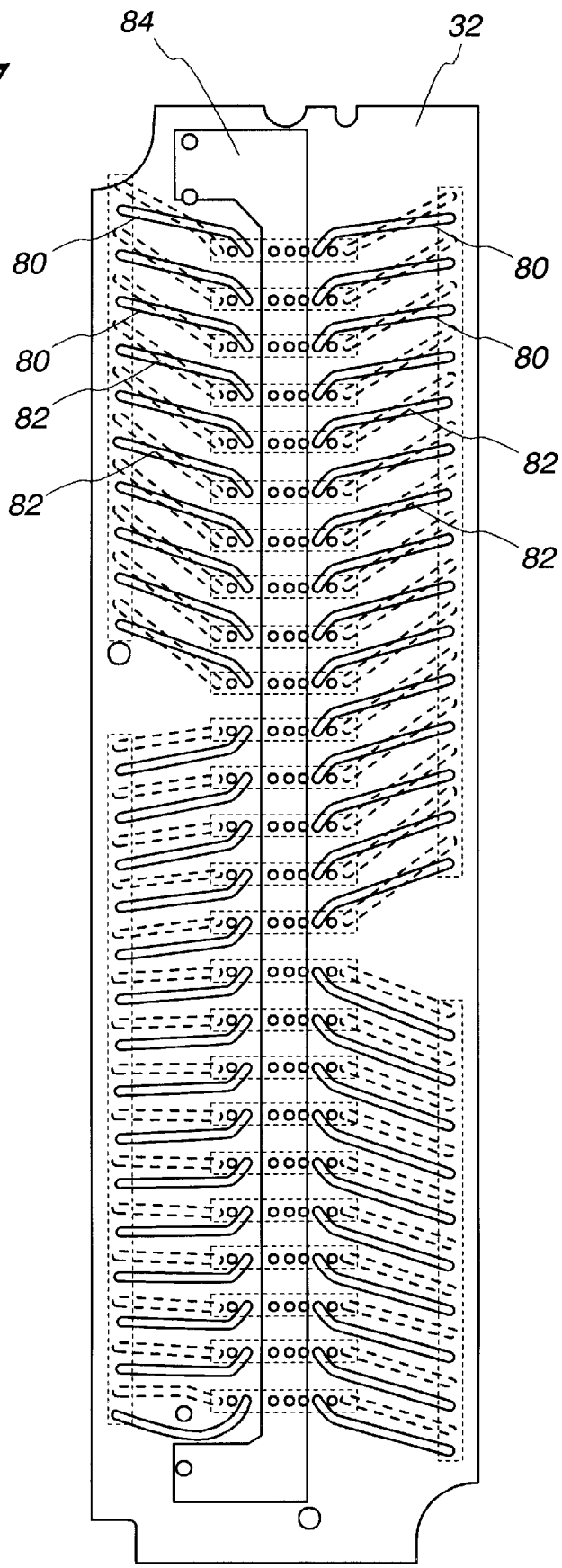
FIG. 7 is a bottom plan view of the main printed circuit board assembly, illustrating the combined layout of the tip and ring conductive traces of FIGS. 5 and 6.
Figure 8:
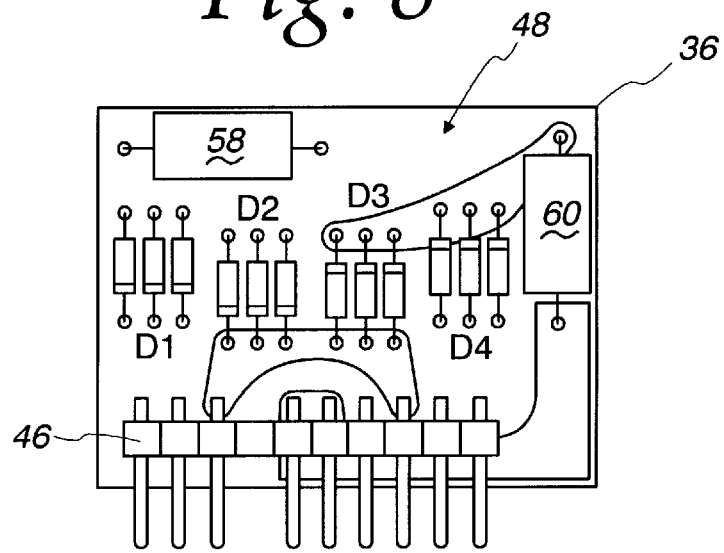
FIG. 8 is an enlarged view of one of the auxiliary miniature printed circuit boards having a Category 5/circuit surge protector device.

The layout for the 25-pairs of tip and ring conductive traces on the main printed circuit board 32 can be best understood by reference to FIGS. 5–7 of the drawings. In order to meet the near end crosstalk (NEXT) criteria, Return Loss and Attenuation criteria of the TIA specification for Category 5, the inventors have determined that the pair-to-pair impedance must be increased. In other words, the capacitance between any two adjacent tip conductive traces and any two adjacent ring conductive traces for each of the 25-pairs must be decreased to a small value. It was found that this could be accomplished by increasing the spacing or distance between the adjacent pairs of tip traces and the adjacent pairs of ring traces.

Accordingly, the unique pattern of tip and ring conductive traces for the 25-pairs is formed on the main printed circuit board 32 as illustrated in FIGS. 5–7 so as to cooperate with the electrical components (socket connectors 34 and auxiliary miniature printed circuit boards 36 having a circuit surge protector device 48) mounted thereon in order to meet the TIA specification for Category 5. The plurality of tip conductive traces 80 have been located on the top side of the main printed circuit board 32, as shown in FIG. 5. Each of the adjacent pairs of tip conductive traces on the input side and on the output side are positioned so as to be as far as possible from each other but has been maintained to be parallel to each other and are made to be relatively straight.

Similarly, the plurality of ring conductive traces 82 have been located on the bottom side of the main printed circuit board 32, as illustrated in FIG. 6. Each of the adjacent pairs of ring conductive traces on the input side and on the output side are positioned so as to be as far as possible from each other but have been maintained to be parallel to each other and are made to be relatively straight. It will be noted that the bottom side of the main printed circuit board 32 is formed with an elongated ground conductive trace 84 so as to interconnect the main printed circuit board 32 to an external common ground bus (not shown). Further, the combined layout of the 25-pairs of tip and ring conductive traces 80, 82 on the main printed circuit board of FIGS. 5 and 6 are illustrated in FIG. 7.

From the foregoing detailed description, it can thus be seen that the present invention provides a Category 5/25-pair circuit protection assembly for protecting telephone communication related equipment and the like from power and transient surges which includes a two-piece interfitting housing for receiving the main printed circuit board for mounting sockets therein, a plurality of individual auxiliary miniature printed circuit boards each for mounting a Category 5/circuit surge protector device and for plugging into the respective sockets, an exposed side connector device and a protected side connector device. The housing is designed to fit in the same footprint as that of the conventional 66-M type terminal block. Further, each of the exposed side and protected side connectors may be formed of any one of several different types of connectors so as to provide versatility.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A circuit protection assembly for protecting telecommunication related equipment and the like from power and transient surges, comprising:

a housing formed of co-mating base and cover members, said base and cover members having outer confronting side wall members, said side wall members of said base member being recessed so as to form a cavity;

a main printed circuit board disposed within said cavity of said housing;

a plurality of socket connectors mounted upon said main printed circuit board disposed within said cavity of said housing;

a plurality of auxiliary miniature printed circuit boards, each of said plurality of auxiliary miniature printed circuit boards being mounted in a corresponding one of said plurality of socket connectors;

a plurality of circuit surge protector devices, each of said plurality of circuit surge protector devices being mounted in a corresponding one of said plurality of auxiliary miniature printed circuit boards;

input side electrical connector means for supplying a first 25-pairs of wires to said main printed circuit board; and output side electrical connector means for receiving a second 25-pairs of wires from said main printed circuit board.

2. A circuit protection assembly as claimed in claim 1, wherein said input side electrical connector means includes a 110D connecting block.

3. A circuit protection assembly as claimed in claim 2, wherein said output side electrical connector means includes a 110D connecting block.

4. A circuit protection assembly as claimed in claim 1, wherein said housing is adapted to fit into the footprint of a conventional 66-M type terminal block.

5. A circuit protection assembly as claimed in claim 1, further comprising a card edge connector mounted on each of said plurality of auxiliary miniature printed circuit boards and including a plurality of contacts for effecting electrical connection with a corresponding one of said plurality of auxiliary miniature printed circuit boards.

6. A circuit protection assembly as claimed in claim 1, wherein said main printed circuit board includes a plurality of tip conductive traces formed on a top side thereof and a plurality of ring tip conductive traces formed on a bottom side thereof, each adjacent one of said plurality of tip conductive traces being spaced apart in a parallel relationship and made relatively straight so as to improve crosstalk therebetween, each adjacent ones of said plurality of ring conductive traces being spaced apart in a parallel relationship and made relatively straight so as to improve crosstalk therebetween.

7. A circuit protection assembly as claimed in claim 1, wherein each of said plurality of circuit surge protector devices includes voltage suppressor means and four banks of diode means.

8. A circuit protection assembly as claimed in claim 7, wherein each of said four banks of diode means includes three diodes connected in parallel and said voltage suppressor means includes a pair of silicon avalanche suppressors.

9. A circuit protection assembly as claimed in claim 8, wherein each of said diodes in said four banks of diode means has a low capacitance.

10. A circuit protection assembly for protecting telecommunication related equipment and the like from power and transient surges, comprising:

housing means formed of co-mating base and cover members;

main printed circuit board means disposed within said housing means;

socket connector means mounted upon said main printed circuit board means;

auxiliary miniature printed circuit board means operatively associated with said socket connector means;

circuit surge protector means operatively associated with said auxiliary miniature printed circuit board means;

input side electrical connector means for supplying a first 25-pairs of wires to said main printed circuit board means; and output side electrical connector means for receiving a second 25-pairs of wires from said main printed circuit board means.

11. A circuit protection assembly as claimed in claim 10, wherein said input side electrical connector means includes a 110D connecting block.

12. A circuit protection assembly as claimed in claim 11, wherein said output side electrical connector means includes a 110D connecting block.

13. A circuit protection assembly as claimed in claim 10, wherein said housing means is adapted to fit into the footprint of a conventional 66-M type terminal block.

14. A circuit protection assembly as claimed in claim 10, further comprising a card edge connector mounted on each of said plurality of auxiliary miniature printed circuit board means and including a plurality of contacts for effecting electrical connection with a corresponding one of said plurality of auxiliary miniature printed circuit board means.

15. A circuit protection assembly as claimed in claim 10, wherein said main printed circuit board means includes a plurality of tip conductive traces formed on a top side thereof and a plurality of ring tip conductive traces formed on a bottom side thereof, each adjacent one of said plurality of tip conductive traces being spaced apart in a parallel relationship and made relatively straight so as to improve crosstalk therebetween, each adjacent ones of said plurality of ring conductive traces being spaced apart in a parallel relationship and made relatively straight so as to improve crosstalk therebetween.

16. A circuit protection assembly as claimed in claim 10, wherein said plurality of circuit surge protector means includes voltage suppressor means and four banks of diode means.

17. A circuit protection assembly as claimed in claim 16, wherein each of said four banks of diode means includes three diodes connected in parallel and said voltage suppressor means includes a pair of silicon avalanche suppressors.

18. A circuit protection assembly as claimed in claim 17, wherein each of said diodes in said four banks of diode means has a low capacitance.

\* \* \* \* \*